United States Patent
Kim et al.

(10) Patent No.: US 9,024,373 B2
(45) Date of Patent: May 5, 2015

(54) SEMICONDUCTOR DEVICES HAVING TRANSISTORS CAPABLE OF ADJUSTING THRESHOLD VOLTAGE THROUGH BODY BIAS EFFECT

(71) Applicant: Samsung Electronics Co., Ltd., Suwon-si, Gyeonggi-do (KR)

(72) Inventors: Jun Soo Kim, Anyang-si (KR); Dong Jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/785,810

(22) Filed: Mar. 5, 2013

(65) Prior Publication Data
US 2013/0264630 A1   Oct. 10, 2013

(30) Foreign Application Priority Data
Apr. 9, 2012   (KR) .................. 10-2012-0036627

(51) Int. Cl.
*H01L 29/792*   (2006.01)
*H01L 29/66*   (2006.01)
*H01L 27/108*   (2006.01)
*H01L 49/02*   (2006.01)
*H01L 29/78*   (2006.01)
*H01L 27/088*   (2006.01)

(52) U.S. Cl.
CPC ...... *H01L 29/7926* (2013.01); *H01L 29/66833* (2013.01); *H01L 29/792* (2013.01); *H01L 27/10861* (2013.01); *H01L 27/10876* (2013.01); *H01L 28/91* (2013.01); *H01L 29/7855* (2013.01); *H01L 27/0886* (2013.01)

(58) Field of Classification Search
CPC .................. H01L 29/66833; H01L 21/28282; H01L 29/792; H01L 29/66795; H01L 29/66825; H01L 29/7923
USPC .................................................. 257/316–324
See application file for complete search history.

(56) References Cited

U.S. PATENT DOCUMENTS

| | | |
|---|---|---|
| 7,423,314 B2 | 9/2008 | Mizukoshi |
| 7,498,632 B2 | 3/2009 | Lee |
| 7,601,594 B2 | 10/2009 | Takaya |
| 7,622,761 B2 | 11/2009 | Park et al. |
| 7,842,562 B2 | 11/2010 | Cohen |

(Continued)

FOREIGN PATENT DOCUMENTS

KR   10-0976064 B1   8/2010

OTHER PUBLICATIONS

Nguyen et al., "Ultra-Thin Buried Nitride Integration for Multi-$V_T$, low-Variability and Power Management in Planar FDSOI CMOSFETs", *IEEE 2011 Symposium on VLSI Technology*, Grenoble, France, Jun. 14-16, 2011, pp. 164-165.

*Primary Examiner* — David Vu
*Assistant Examiner* — Jonathan Han
(74) *Attorney, Agent, or Firm* — Myers Bigel Sibley & Sajovec, P.A.

(57) ABSTRACT

Semiconductor devices have transistors capable of adjusting threshold voltages through a body bias effect. The semiconductor devices include transistors having a front gate on a substrate, a back gate between adjacent transistors, and a carrier storage layer configured to surround the back gate and to trap a carrier. A threshold voltage of a transistor may be changed in response to voltage applied to the back gate. Related fabrication methods are also described.

10 Claims, 16 Drawing Sheets

(56) References Cited

U.S. PATENT DOCUMENTS

| | | |
|---|---|---|
| 7,863,673 B2 | 1/2011 | Kim et al. |
| 8,063,427 B2 | 11/2011 | Goarin |
| 8,106,444 B2 | 1/2012 | Terai |
| 2005/0003592 A1* | 1/2005 | Jones ............................ 257/365 |
| 2007/0018237 A1 | 1/2007 | Kim et al. |
| 2007/0247924 A1 | 10/2007 | Zheng et al. |
| 2007/0284648 A1 | 12/2007 | Park et al. |
| 2007/0296033 A1 | 12/2007 | Park et al. |
| 2008/0064149 A1 | 3/2008 | Cohen |
| 2008/0087942 A1* | 4/2008 | Hsu et al. ...................... 257/324 |
| 2008/0099831 A1 | 5/2008 | Mizukoshi |
| 2008/0157172 A1 | 7/2008 | Lee |
| 2008/0203462 A1* | 8/2008 | Goarin .......................... 257/316 |
| 2008/0254585 A1 | 10/2008 | Takaya |
| 2009/0206385 A1 | 8/2009 | Kim et al. |
| 2010/0025753 A1 | 2/2010 | Terai |
| 2011/0051535 A1* | 3/2011 | Song et al. .................... 257/365 |

* cited by examiner

Vth increase

Vth decrease

Vth2 > Vth1 > Vth3

Vth increase

Vth decrease

# US 9,024,373 B2

SEMICONDUCTOR DEVICES HAVING TRANSISTORS CAPABLE OF ADJUSTING THRESHOLD VOLTAGE THROUGH BODY BIAS EFFECT

CROSS-REFERENCE TO RELATED APPLICATION

This application claims priority under 35 U.S.C. §119 of Korean Patent Application 10-2012-0036627 filed on Apr. 9, 2012, the disclosure of which is hereby incorporated by reference in its entirety.

BACKGROUND

The present inventive concepts relate to semiconductor devices and, more particularly, to semiconductor devices having transistors capable of adjusting threshold voltage and methods for fabricating the same.

Insulated gate field effect transistors, commonly referred to as MOSFETs, include spaced apart source and drain regions and a channel region therebetween. Operation of the MOSFET is controlled by a voltage that is applied to an insulated gate on the channel region. A threshold voltage of a MOSFET is the gate voltage at which the transistor turns on.

Generally, ion implantation processes are used to adjust threshold voltages of semiconductor devices. To obtain various values of the threshold voltage in one wafer, the ion implantation process for adjustment of the threshold voltage may require a plurality of photolithography processes in proportion to the number of threshold voltages, so that cost may increase. In fully depleted devices, there may also be problems such as incomplete doping on a small dimension wafer and variation of the threshold voltage.

SUMMARY

Embodiments of the inventive concepts provide semiconductor devices and methods for fabricating the same, in which threshold voltage values are intentionally adjusted using the body bias effect.

Other embodiments of the inventive concepts provide semiconductor devices and methods for fabricating the same, in which the value of threshold voltage is adjusted in response to voltage supplied to a back gate.

Still other embodiment of the inventive concepts provide semiconductor devices and methods for fabricating the same, in which threshold voltages for different transistors are differently determined according to value and/or applying time of voltage supplied to a back gate.

According to various embodiments of the present inventive concepts, a semiconductor device may comprise a plurality of transistors, each including a front gate on a substrate, a back gate between adjacent transistors, and a carrier storage layer configured to surround the back gate and to trap a carrier. A threshold voltage of at least one of the transistors may be changed in response to voltage applied to the back gate.

In some embodiments, the carrier storage layer may comprise a tunneling dielectric layer adjacent the substrate, a blocking dielectric layer adjacent the back gate, and a carrier storable layer disposed between the tunneling dielectric layer and the blocking dielectric layer. The carrier storable layer may be a trap dielectric layer and/or a conductive layer.

In other embodiments, the plurality of transistors may comprise a plurality of fin field effect transistors (FinFETs). The FinFETs may comprise a plurality of fins vertically protruding from the substrate and spaced apart from each other in a first direction parallel to a top surface of the substrate. The front gate is on the fins and extends in a second direction parallel to the top surface of the substrate crossing the first direction. The fin may comprise a channel overlapping with the front gate and junctions disposed at opposing lateral portions of the channel. The junctions are non-overlapping with the front gate.

In still other embodiments, the back gate may comprise a plurality of second gates embedded in the substrate between the FinFETs. The carrier storage layer may be disposed between the second gate and the substrate on bottom and lateral surfaces of the second gate.

In even other embodiments, the semiconductor device may further comprise a device isolation layer on a top surface of the second gate.

In yet other embodiments, threshold voltages of the FinFETs may be changed to have different values in response to voltage applied to the back gate.

In further embodiments, the plurality of transistors may comprise at least two vertical channel transistors (VCTs) each including a vertical channel extending from the substrate and the front gate disposed on an lateral side of the vertical channel. The vertical channel may comprise a drain and the substrate may comprise a source below a lateral side of the front gate.

In still further embodiments, the back gate may be disposed on the substrate between confronting lateral sides of the adjacent vertical channels. The carrier storage layer may be disposed on the substrate between the vertical channel and the back gate on bottom and lateral surfaces of the back gate.

In even further embodiments, threshold voltages of the at least two VCTs may be changed to have a same value in response to voltage applied to the back gate.

In yet further embodiments, the plurality of transistors may comprise first, second and third fin field effect transistors (FinFETs). The first to third FinFETs may comprise first, second and third fins, respectively, on the substrate, the first to third fins being spaced apart from each other in a first direction, and the front gate on the substrate extending in a second direction crossing the first direction to overlap the first to third fins. The back gate may comprise a first back gate embedded in the substrate between the first and second FinFETs and a second back gate embedded in the substrate between the second and third FinFETs. The first back gate may be supplied with a first voltage and the second back gate may be supplied with a second voltage which is different from the first voltage such that respective first, second and third threshold voltages of the first to third FinFETs are changed to have different values. The second, first and third threshold voltages may be sequentially arranged in an ascending or descending value.

In yet further embodiments, the plurality of transistors may comprise first and second vertical channel transistors (VCTs). The first and second VCTs may comprise first and second vertical channels, respectively, vertically extending from the substrate, the back gate being interposed between the first and second vertical channels, and first and second front gates overlapping with outer lateral sides of the first and second vertical channels, respectively. The back gate may be supplied with voltage such that respective first and second threshold voltages of the first and second VCTs may be changed to have a same value.

According to further embodiments, a semiconductor device may comprise a substrate, a first transistor in the substrate and a second transistor in the substrate and spaced apart from the first transistor. The first transistor comprises first source and drain regions and a first channel therebetween.

The second transistor comprises second source and drain regions that are spaced apart from the respective first source and drain regions and a second channel therebetween that is spaced apart from the first channel. A carrier storage region is provided in the substrate between the first and second transistors. The carrier storage region is configured to trap carriers therein so as to change threshold voltages of the first and second transistors.

In other embodiments, an electrode is provided that is configured to store carriers in the carrier storage region. In yet other embodiments, the carrier region is on the electrode and extends from a face of the electrode to opposite sides thereof. In still other embodiments, the carrier storage region is configured to trap carriers therein, so as to differently change the threshold voltages of the first and second transistors.

In some embodiments, the substrate comprises first and second protruding fins that are spaced apart from one another and extend parallel to one another, wherein the first source and drain regions and the first channel region are in the first protruding fin and wherein the second source and drain regions and the second channel region are in the second protruding fin. In other embodiments, the first and second source regions are adjacent a face of the substrate, the first and second drain regions are remote from the face of the substrate and the respective first and second channel regions are between the respective first and second source regions and the respective first and second drain regions.

According to various embodiments of the present inventive concepts, a method for fabricating a semiconductor device may comprise forming a trench in a substrate, forming a carrier storage layer extending along an inner surface of the trench, and forming a back gate in the trench and being surrounded by the carrier storage layer. The substrate is patterned to form a channel. A front gate is formed overlapping with the channel, and junctions are formed at opposing portions of the channel.

In some embodiments, forming the carrier storage layer may comprise forming a composite layer on the substrate including a carrier storable layer interposed between at least two dielectric layers and extending along the inner surface of the trench, and planarizing the composite layer to expose the substrate such that the carrier storage layer is formed in the trench. The carrier storage layer may comprise one of a nitride oxide layer and a conductive layer.

In other embodiments, forming the channel may comprise forming a dielectric block on the substrate on the carrier storage layer and the back gate, forming a vertical fin on the substrate outside the dielectric block, and recessing the dielectric block to expose a lateral side of the fin. The lateral side of the fin may be overlapped with the front gate to serve as the channel.

In still other embodiments, forming the channel may comprise etching the substrate to form recessed regions which are spaced apart from the trench such that the channel is formed between the trench and the recessed region. The back gate and the front gate may be formed simultaneously by forming and planarizing a conductive layer in the recessed regions.

BRIEF DESCRIPTION OF THE DRAWINGS

The foregoing and other features and advantages of various embodiments of the inventive concepts will be apparent from the more particular description of non-limiting embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF PREFERRED EMBODIMENTS

Figure 1A:
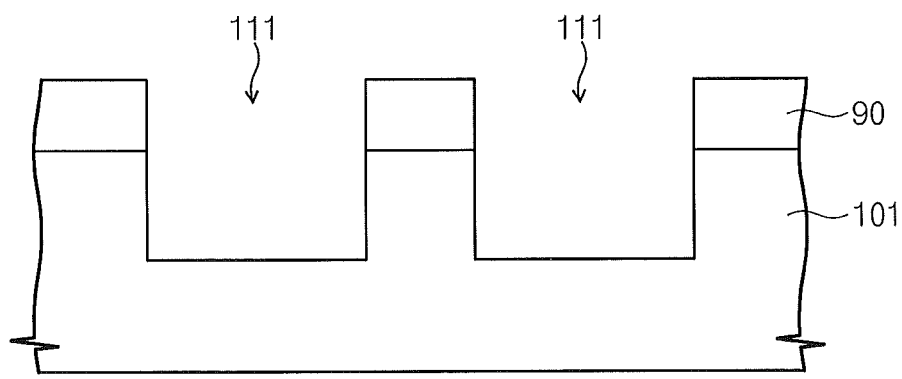
FIGS. 1A to 1H are cross-sectional views illustrating a method for fabricating a semiconductor device according to some embodiments of the present inventive concepts.

Example embodiments of the inventive concepts will now be described more fully hereinafter with reference to the accompanying drawings, in which some example embodiments of the inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of the inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Aspects of example embodiments of inventive concepts explained and illustrated herein include their complementary counterparts.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A to 1H are cross-sectional views illustrating a method for fabricating a semiconductor device according to some embodiments of the present inventive concepts.

Referring to FIG. 1A, a semiconductor substrate 101 may be patterned to form at least one trench 111. The semiconductor substrate 101 may comprise a silicon wafer which is doped with impurities, for example p-type dopant. The semiconductor substrate 101 may include a single element and/or compound semiconductor material, such as silicon or silicon carbide, and one or more layers, such as silicon nitride, silicon oxide, polyimide, a photosensitive polyimide, benzocyclobutene (BCB), and/or other organic or inorganic polymers. Substrates that include glass or metal may also be used. As an exemplary embodiment, a mask 90 may be formed on the semiconductor substrate 101 by coating and photo processes, and then the semiconductor substrate 101 may be patterned by a dry and/or wet etching process using the mask 90 to form the trench 111. The mask 90 may be removed by an ashing process. Alternatively, the mask 90 may be formed by depositing and patterning at least one dielectric layer.

Figure 1B:
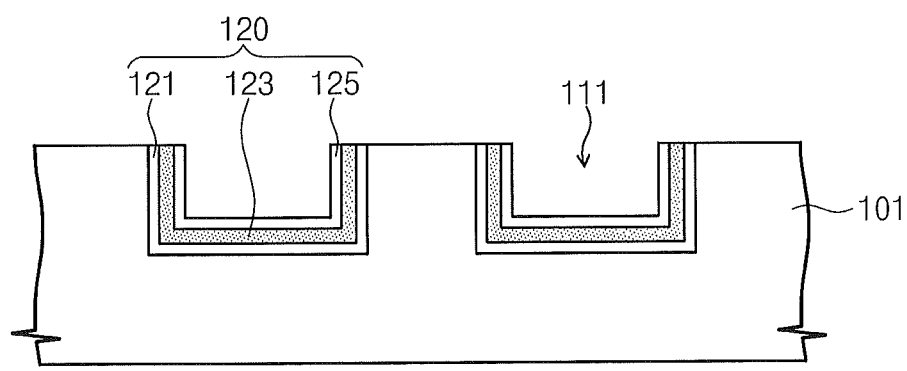

Referring to FIG. 1B, a carrier storage layer 120 may be formed. The carrier storage layer 120 may comprise a tunneling dielectric layer 121, a trap dielectric layer 123, and a blocking dielectric layer 125. As an embodiment, the tunneling dielectric layer 121 may comprise a silicon oxide layer, the trap dielectric layer 123 may comprise a silicon nitride layer, and the blocking dielectric layer 125 may comprise silicon oxide layer, a high-k dielectric layer such as an aluminum oxide layer and/or hafnium oxide layer, or any combinations thereof. For example, the carrier storage layer 120 may formed by sequentially deposing the silicon oxide layer, silicon nitride layer, and silicon oxide layer and then planarizing the layers using a CMP and/or an etch back process. Alternatively, the trap dielectric layer 123 may be replaced by a conductive layer such as polysilicon layer or metal layer. The carrier storage layer 120 may have a bracket shape which extends along the inner surface of the trench 111.

Figure 1C:
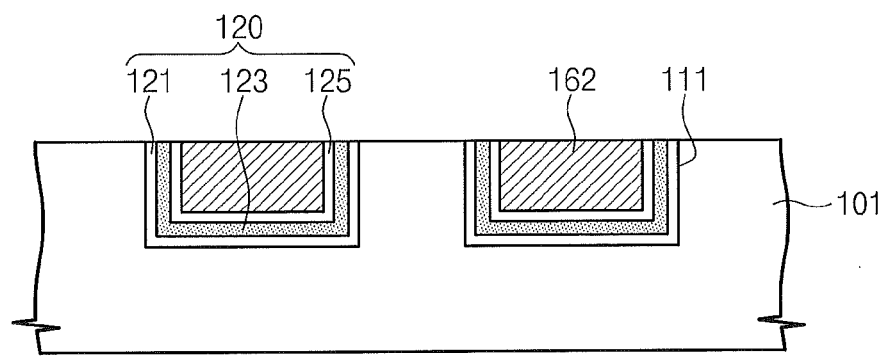

Referring to FIG. 1C, a back gate 162 may be formed. For example, the back gate 162 may be formed by depositing a conductor on the substrate 101 to completely fill the trench 111 and then planarizing by a CMP or an etch back process. A top surface of the back gate 162 may be coplanar with a top surface of the semiconductor substrate 101. Bottom (face) and lateral (side) surfaces of the back gate 162 may be covered with the carrier storage layer 120.

Figure 1D:
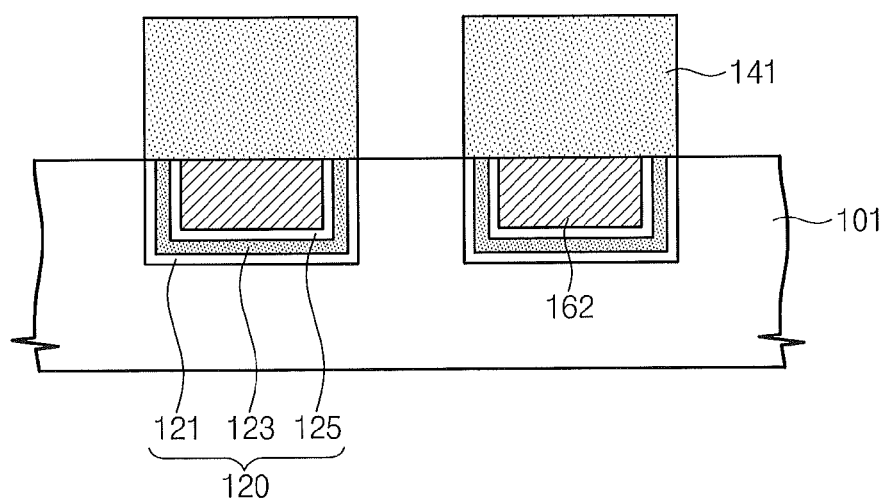

Referring to FIG. 1D, a dielectric block 141 may be formed on the semiconductor substrate 101. For example, a high density plasma oxide (HDP) layer may be deposited and then patterned by a photolithography process to form the dielectric block 141. The dielectric block 141 may cover the carrier storage layer 120 and expose the top surface of the semiconductor substrate 101.

Figure 1E:
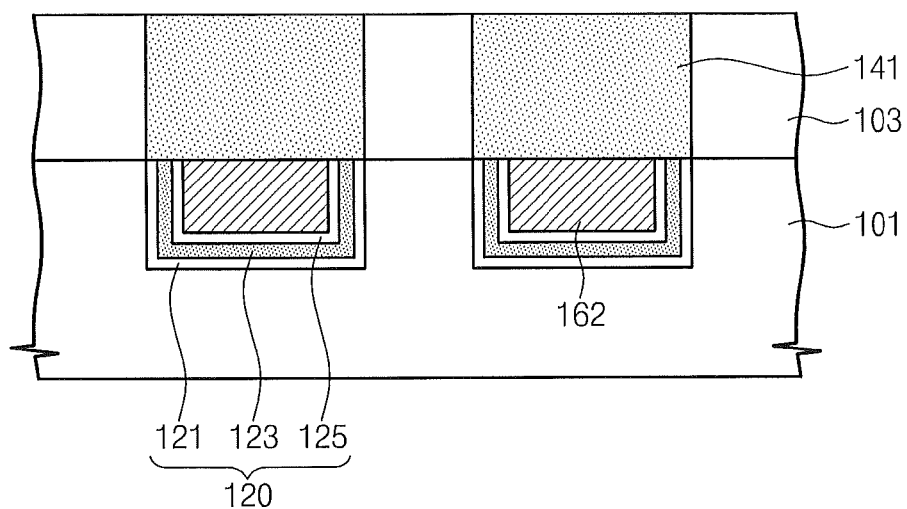

Referring to FIG. 1E, a fin 103 may be formed to extend vertically from the top surface of the semiconductor substrate 101. For example, the fin 103 may be formed by epitaxially growing undoped silicon on a portion of the substrate 101 which is not covered by the dielectric block 141. As another example, the fin 103 may be formed by epitaxially growing silicon doped with impurities such as p-type dopant. As still another example, the fin 103 may be formed by depositing silicon to fill a space between the adjacent dielectric blocks 141. The dielectric block 141 may serve as a mask during the formation of the fin 103.

Figure 1F:
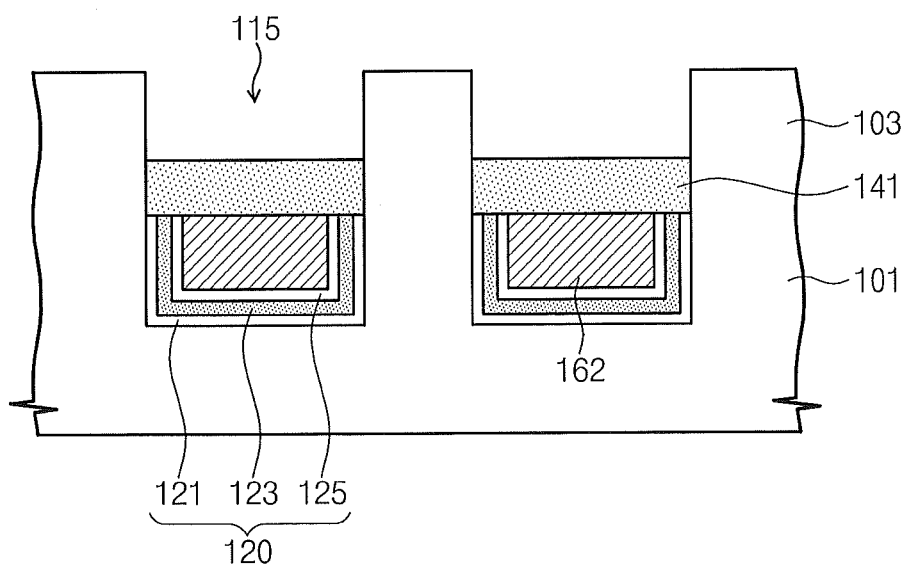

Referring to FIG. 1F, the dielectric block 141 may be recessed. The recess of the dielectric block 141 may define a recessed region 115 between the adjacent fins 103. The recessed region 115 may expose confronting (facing) lateral sides of the adjacent fins 103. The recessed dielectric block 141 may serve as a device isolation layer which electrically insulates the adjacent fins 103.

Figure 1G:
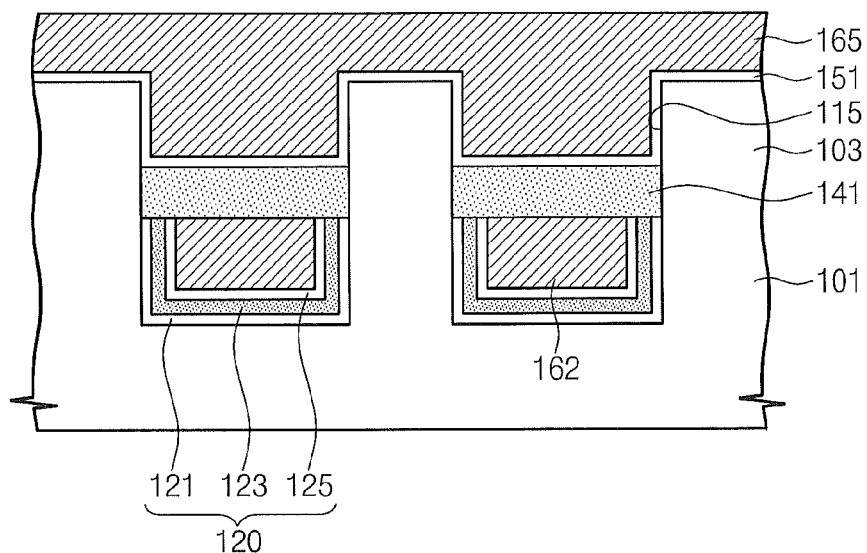

Referring to FIG. 1G, a gate insulation layer 151 and a front gate 165 may be formed. For example, a conductive layer may be formed on a dielectric layer which was formerly formed by thermally oxidizing the fin 103 or depositing, and then the conductive and dielectric layers may be patterned to form the gate insulation layer 151 and the front gate 165 which expose front and rear edges of the fin 103. The gate insulation layer 151 and the front gate 165 may be formed of polysilicon and metal, respectively. The front gate 165 may extend in a first horizontal direction (for example, left and right direction) and the fin 103 may extend in a second horizontal direction (for example, front and rear direction) crossing the first horizontal direction. The second horizontal direction may be parallel to the top surface of the semiconductor substrate 101 and may be perpendicular to the first horizontal direction. The fin 103 may have top and lateral (side) surfaces which are overlapped with the front gate 165 so that the top and lateral surfaces of the fin 103 may serve as a channel.

Figure 1H:
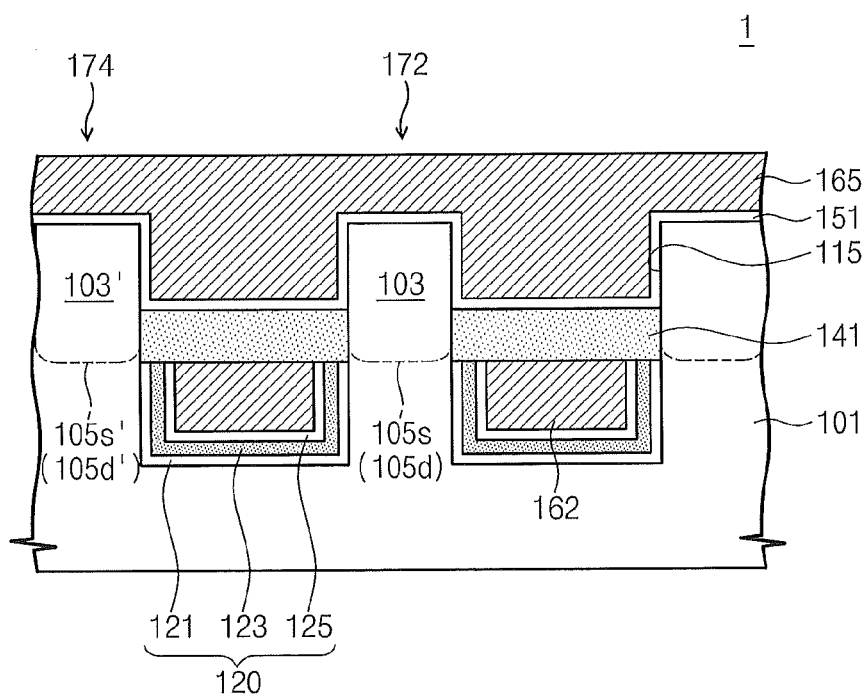
Figure 1I:
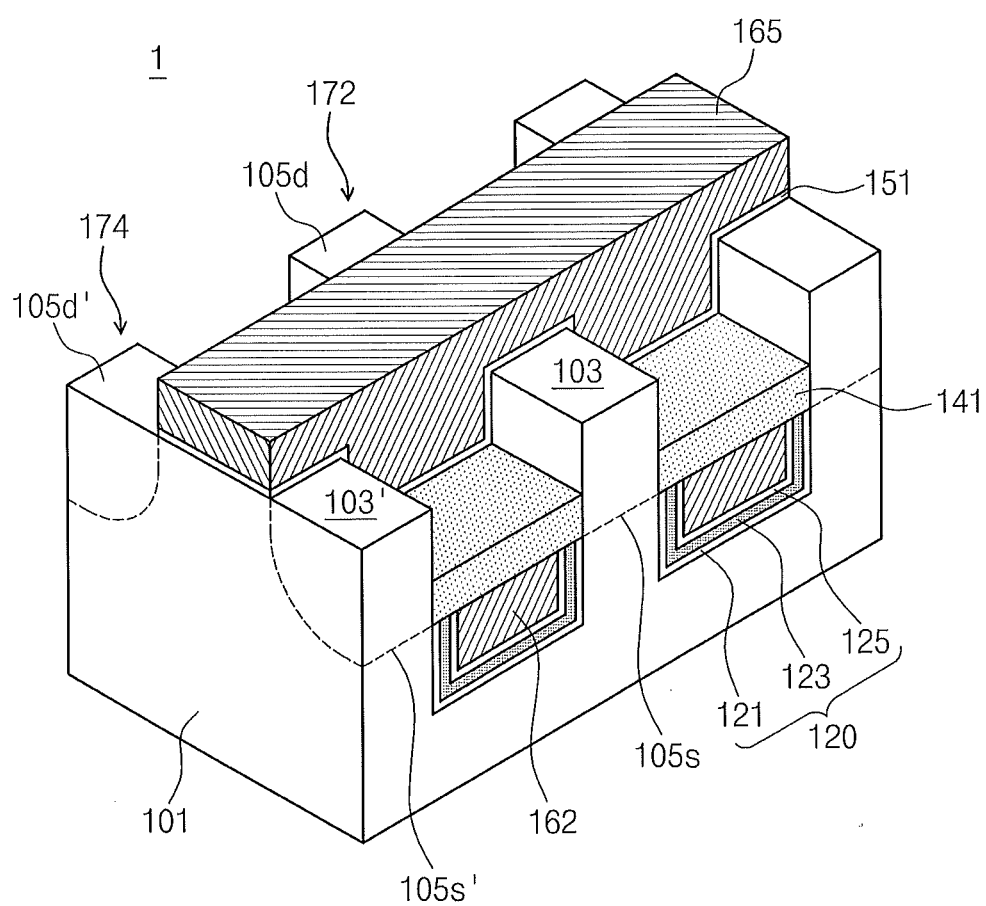
FIG. 1I is a perspective view of FIG. 1H.

Referring to FIGS. 1H and 1I, junctions 105s and 105d may be formed by doping impurities (for example, n-type dopant) to the exposed front and rear ends of the fin 103 which are not overlapped with the front gate 165. Thus, a semiconductor device 1 may be formed to have at least one fin field effect transistor (FinFET). The fin 103 may have a bar shape extending front and rear direction, and the junctions 105s and 105d may be formed on the front and rear ends of the fin 103. One (for example, the source 105s) of the junctions 105s and 105d may be showed in FIG. 1H. The semiconductor device 1 may be applied to the memory device and/or the logic device. For example, the semiconductor device 1 may be a DRAM having the FinFET and a capacitor electrically connected to the FinFET.

FIGS. 1H and 1I may also be regarded as illustrating a semiconductor device 1 according to various embodiments described herein that includes a substrate 101, a first transistor 172 and a second transistor 174 that is spaced apart from the first transistor 172, in the substrate 101. The first transistor 172 comprises first source and drain regions 105s, 105d, and a channel region therebetween, and the second transistor 174 comprises second source and drain regions 105s', 105d' that are spaced apart from the respective first source and drain regions 105s, 105d and a second channel therebetween that is spaced apart from the first channel. A carrier storage region 120 is provided in the substrate 101 between the first and second transistors 172 and 174. The carrier storage region 120 is configured to trap carriers therein, so as to change threshold voltages of the first and second transistors 172 and 174. An electrode 162 may also be provided that is configured to storage carriers in the carrier storage region 120. The carrier storage region 120 may be on the electrode 162 and extend from a face (for example the bottom face) of the electrode 162 to opposite sides thereof. Moreover, in some embodiments, the substrate 101 comprises first and second protruding fins 103, 103', that are spaced apart from one another and extend parallel to one another. The first source and drain regions 105s, 105d and the first channel region are in the first fin 103, and the second source and drain regions 105s', 105d' and the second channel region are in a second fin 103'.

According to some exemplary embodiments, the semiconductor device 1 may be set up to have at least one desired value of threshold voltage using a body bias instead of an ion implantation as described below.

FIGS. 2A to 2D are cross-sectional views illustrating a method of adjusting threshold voltage of a semiconductor device according to some embodiments of the present inventive concepts.

Figure 2A:
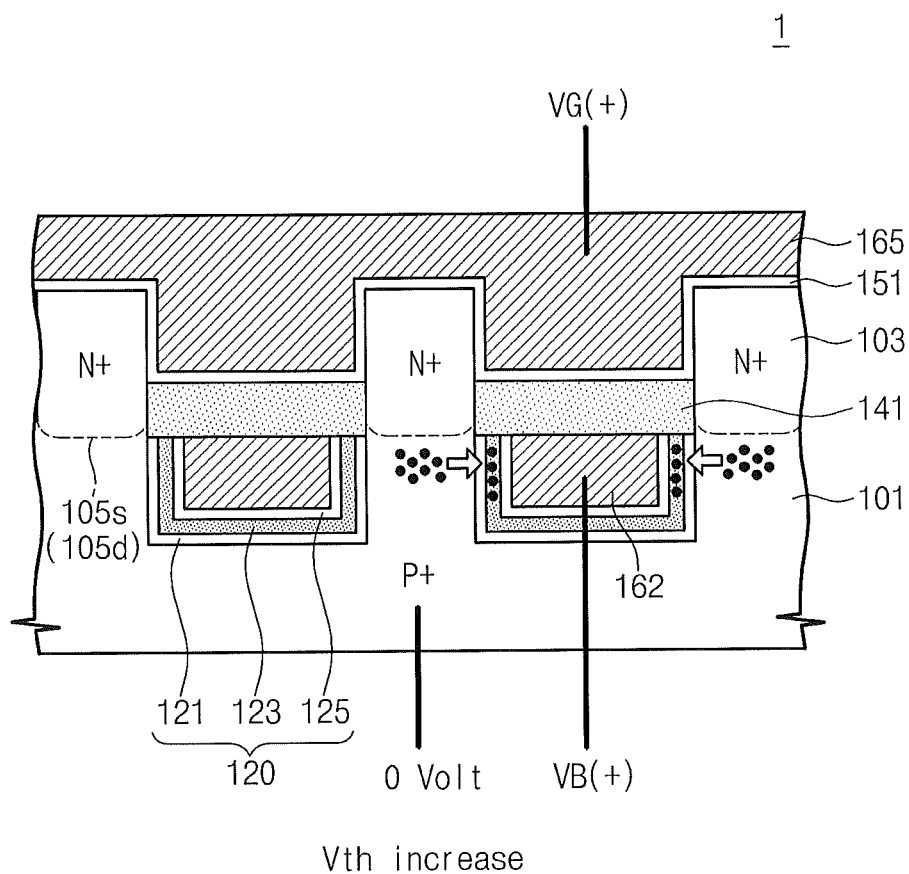
FIGS. 2A to 2D are cross-sectional views illustrating a method of adjusting threshold voltage of a semiconductor device according to some embodiments of the present inventive concepts.

Referring to FIG. 2A, the semiconductor substrate 101 may be supplied with 0 volt and the back gate 162 may be supplied with a positive back gate voltage VB(+). In this case, electrons (designated as solid circles) may tunnel through the tunneling dielectric layer 121 and then be stored in the trap dielectric layer 123. According to the electron migration and trapping, a value of the threshold voltage Vth may be increased due to an expansion of the depletion width. If the semiconductor device 1 is an NMOS type, the transistors at both sides of the back gate 162 may have an increased threshold voltage Vth under the condition that 0 volt is supplied to the semiconductor substrate 101 and the positive gate voltage VG(+) is supplied to the front gate 165. According to some embodiments, the positive back gate voltage VB(+) may be applied to the back gate 162 such that the threshold voltage of the transistors can be diversely (differently) changed or adjusted.

Figure 2B:
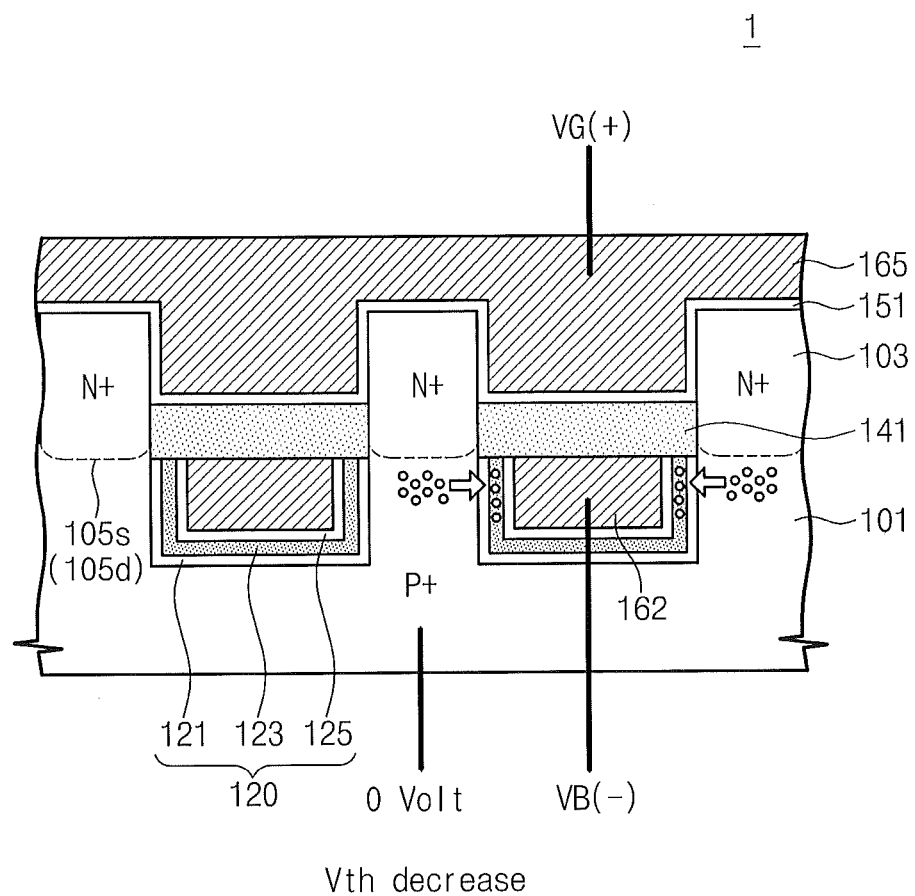

Referring to FIG. 2B, the semiconductor substrate 101 may be supplied with 0 volt and the back gate 162 may be supplied with a negative back gate voltage VB(−). In this case, holes (designated as hollow circles) may migrate into the trap dielectric layer 123 and may be stored in the trap dielectric layer 123. According to the hole migration and trapping, a value of the threshold voltage Vth may be decreased due to a shrinkage of the depletion width. If the semiconductor device 1 is an NMOS type, the transistors at both sides of the back gate 162 may have a decreased threshold voltage Vth under the condition that 0 volt is supplied to the semiconductor substrate 101 and the positive gate voltage VG(+) is supplied to the front gate 165. According to some embodiments, the negative back gate voltage VB(−) may be applied to the back gate 162 such that the transistors can have diverse threshold voltage values.

Figure 2C:
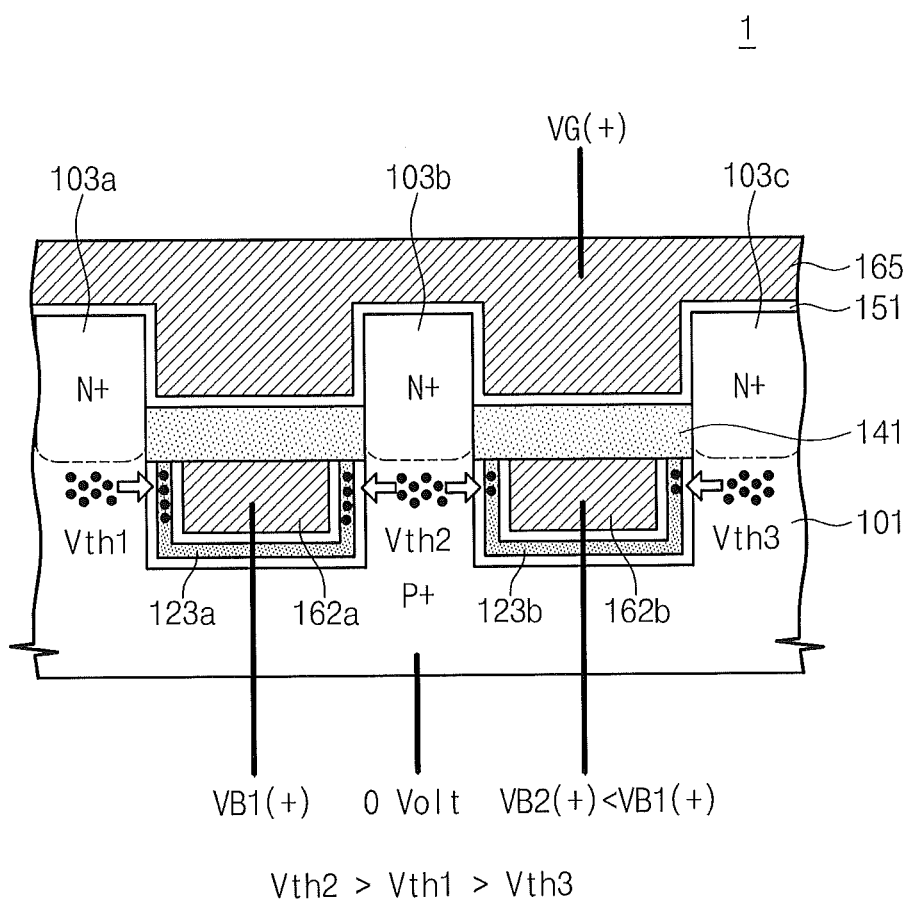

Referring to FIG. 2C, a first back gate 162a may be supplied with a first positive back gate voltage VB1(+) and a second back gate 162b may be supplied with a second positive back gate voltage VB2(+) which is relatively lower than the first positive back gate voltage VB1(+). In this case, a first trap dielectric layer 123a of the first back gate 162a may store electrons greater than a second trap dielectric layer 123b of the second back gate 162b. A raise of value of the positive back gate voltage VB(+) may increase the depletion width and the value of the threshold voltage Vth.

According to the principle described above, a value of a first threshold voltage Vth1 of a first transistor corresponding to a first fin 103a which is disposed at a left side of the first back gate 162a may be greater than a value of a second threshold voltage Vth2 of a second transistor corresponding to a second fin 103b which is disposed at a right side of the first back gate 162a (that is, a left side of the second back gate 162b). The value of the first threshold voltage Vth1 may be greater than a value of a third threshold voltage Vth3 of a third transistor corresponding to a third fin 162c which is disposed at a right side of the second back gate 162b. Consequently, the relationship between the values of the positive back gate voltage VB(+) and threshold voltage Vth may be shown as:

$$Vth2 > Vth1 > Vth3, \text{ if } VB1(+) > VB2(+).$$ [Eq. 1]

Alternatively, if an applying time of the first positive back gate voltage tVB1(+) is longer than an applying time of the second positive back gate voltage tVB2(+), the first trap dielectric layer 123a may store electrons greater than a second trap dielectric layer 123b. Like the Equation 1, the relationship between the applying time of the positive back gate voltage tVB(+) and the value of the threshold voltage Vth may be given by:

$$Vth2 > Vth1 > Vth3, \text{ if } tVB1(+) > tVB2(+).$$ [Eq. 2]

Figure 2D:
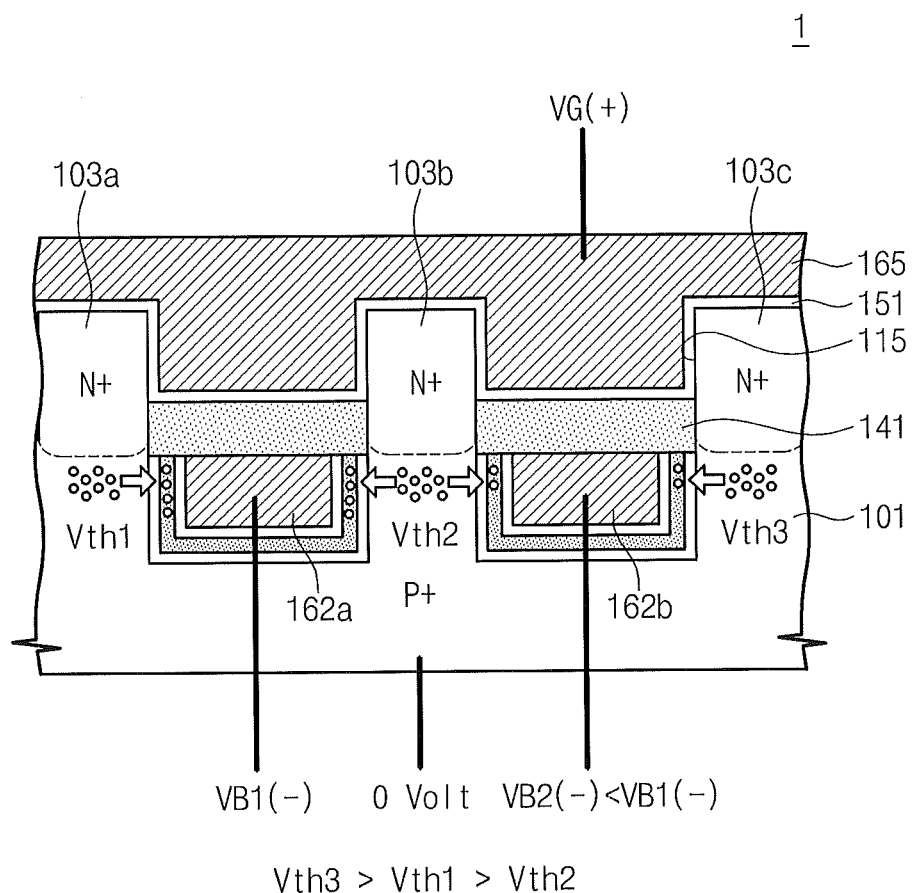

Referring to FIG. 2D, the first back gate 162a may be supplied with a first negative back gate voltage VB1(−) and the second back gate 162b may be supplied with a second negative back gate voltage VB2(−) of which absolute value is smaller than an absolute value of the first negative back gate voltage VB1(−). The value of the negative back gate voltage VB(−) may mean an absolute value. In this case, the first trap dielectric layer 123a may store holes greater than the second trap dielectric layer 123b. A raise of absolute value of the negative back gate voltage VB(−) may decrease the depletion width and the value of the threshold voltage Vth.

Consequently, the value of the first threshold voltage Vth1 may be greater than the value of the second threshold voltage Vth2 and smaller than the value of the third threshold voltage Vth3. Therefore, the relationship between the values of the negative back gate voltage VB(−) and threshold voltage Vth may be shown as:

$$Vth3 > Vth1 > Vth2, \text{ if } VB1(-) > VB2(-). \quad [\text{Eq. 3}]$$

Alternatively, if an applying time of the first negative back gate voltage tVB1(−) is longer than an applying time of the second negative back gate voltage tVB2(−), the first trap dielectric layer 123a may store holes greater than a second trap dielectric layer 123b. Likewise the Equation 3, the relationship between the applying time of the negative back gate voltage tVB(−) and the value of the threshold voltage Vth may be given by:

$$Vth3 > Vth1 > Vth2, \text{ if } tVB1(-) > tVB2(-). \quad [\text{Eq. 4}]$$

According to various embodiments, the values and/or applying times of the back gate voltages VBs may adjust the values of the threshold voltages same or different as shown in Equations 1 to 4.

FIGS. 3A to 3F are cross-sectional views illustrating a method for fabricating a semiconductor device according to other embodiments of the present inventive concepts.

Figure 3A:
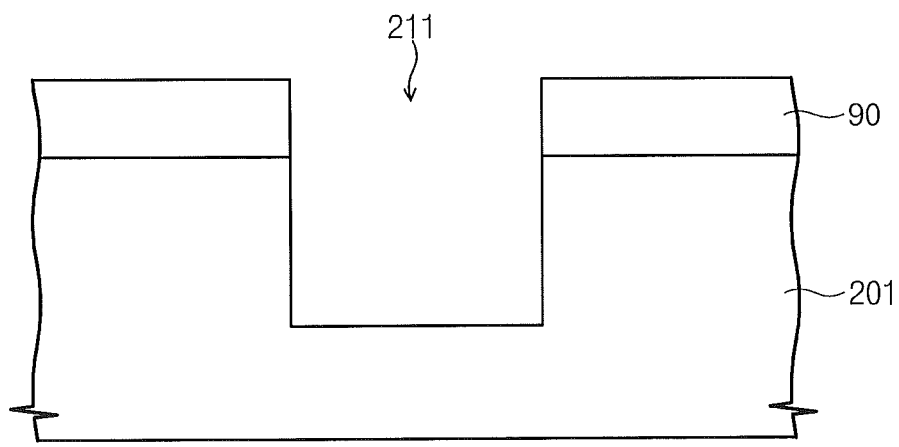
FIGS. 3A to 3F are cross-sectional views illustrating a method for fabricating a semiconductor device according to other embodiments of the present inventive concepts.

Referring to FIG. 3A, a mask 90 may be formed by patterning photoresist coated on a semiconductor substrate 201 and then a trench 211 may be formed by an etch process using the mask 90. The semiconductor substrate 201 may be a silicon wafer which is doped with impurities such as p-type dopant. The substrate 101 may include a single element and/or compound semiconductor material, such as silicon or silicon carbide, and one or more layers, such as silicon nitride, silicon oxide, polyimide, a photosensitive polyimide, benzocyclobutene (BCB), and/or other organic or inorganic polymers. Substrates that include glass or metal may also be used. The mask 90 may be removed by an ashing process.

Figure 3B:
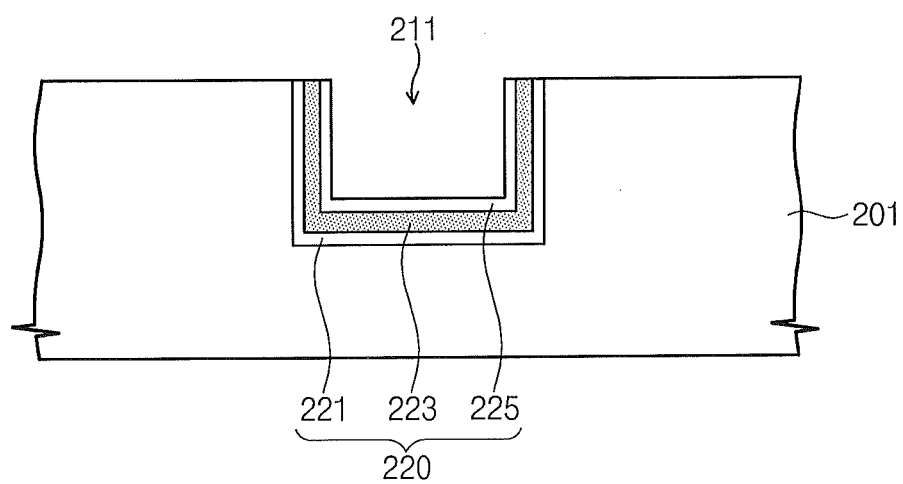

Referring to FIG. 3B, a carrier storage layer 220 may be formed. The carrier storage layer 220 may have a bracket shape which extends along an inner surface of the trench 211. For example, silicon oxide layer, silicon nitride layer and silicon oxide layer may be sequentially deposited on the semiconductor substrate 201 and then planarized using a CMP and/or an etch back process to form the carrier storage layer 220. The carrier storage layer 220 may comprise an tunneling dielectric layer 221, a trap dielectric layer 223 and a blocking dielectric layer 225 which are stacked one atop the other in the foregoing sequence. The trap dielectric layer 223 may be replaced with one of polysilicon and metal layers.

Figure 3C:
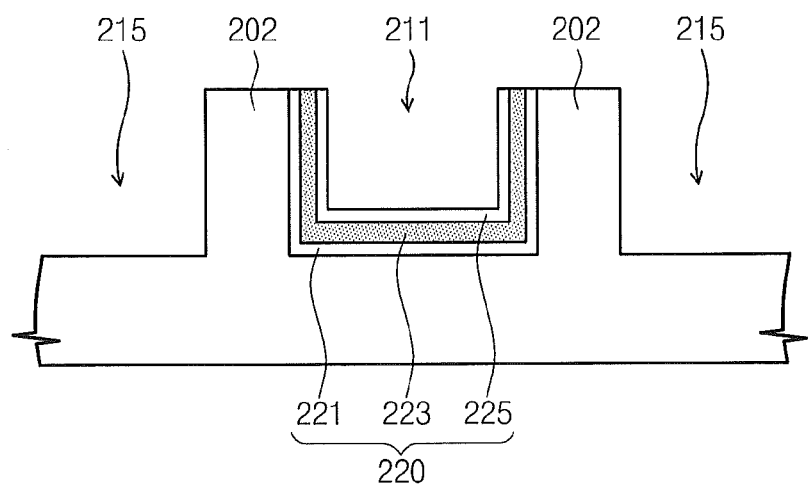

Referring to FIG. 3C, a vertical channel 202 may be formed. For example, the semiconductor substrate 201 may be etched to form the recess regions 215 which are spaced apart from lateral sides of the trench 211 such that a pair of vertical channels 202 may be formed between the recess regions 215 and the trench 211. A bottom surface (face) of the recess region 215 may have the same level with a bottom surface of the trench 211. Alternatively, the bottom surface of the recess region 215 may be higher or lower than the bottom surface of the trench 211.

Figure 3D:
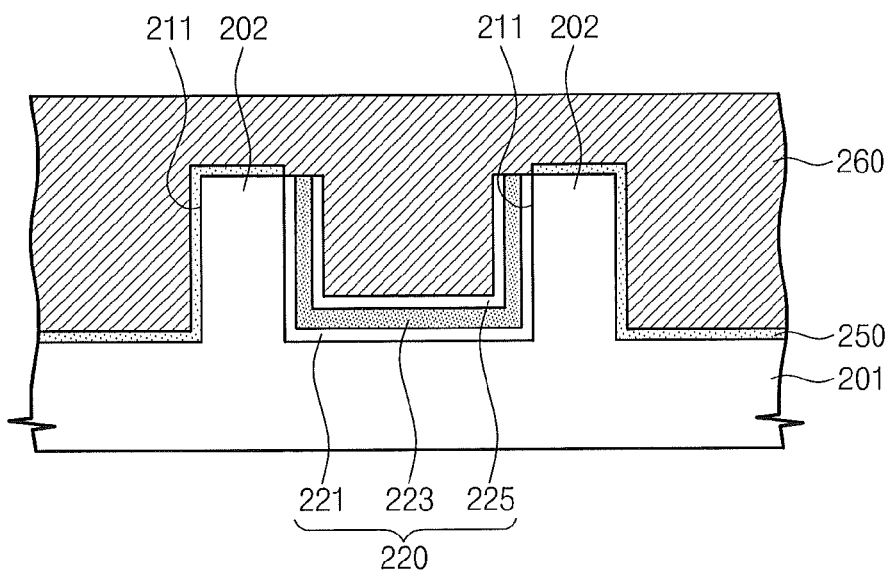

Referring to FIG. 3D, an insulation layer 250 and a conductive layer 260 may be sequentially formed to cover the semiconductor substrate 201. The insulation layer 250 may comprise a silicon oxide layer which is formed by thermally oxidizing the semiconductor substrate 201. The conductive layer 260 may be formed to completely fill the trench 211 by depositing polysilicon or metal.

Figure 3E:
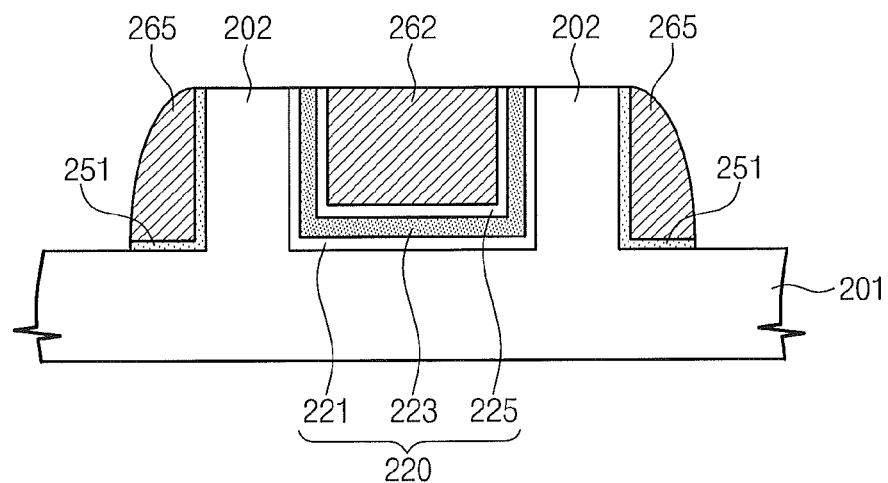

Referring to FIG. 3E, the insulation layer 250 and the conductive layer 260 may be planarized to expose the vertical channel 202 by a CMP and/or an etch back process such that a gate insulation layer 251, a front gate 265 and a back gate 262 may be formed. In some embodiments, the back gate 262 may be formed between confronting (facing) inner sidewalls of adjacent two vertical channels 202 through the planarization process, and two front gates 265 may be formed on outer (opposing) sidewalls of the adjacent two vertical channels 202 simultaneously with the formation of the back gate 262. The front gate 265 may have a spacer shape which stands upright along the outer sidewall of the vertical channel 202. A top surface of the back gate 262 may be coplanar with a top surface of the vertical channel 202, and bottom and lateral surfaces of the back gate 262 may be covered by the carrier storage layer 220.

Figure 3F:
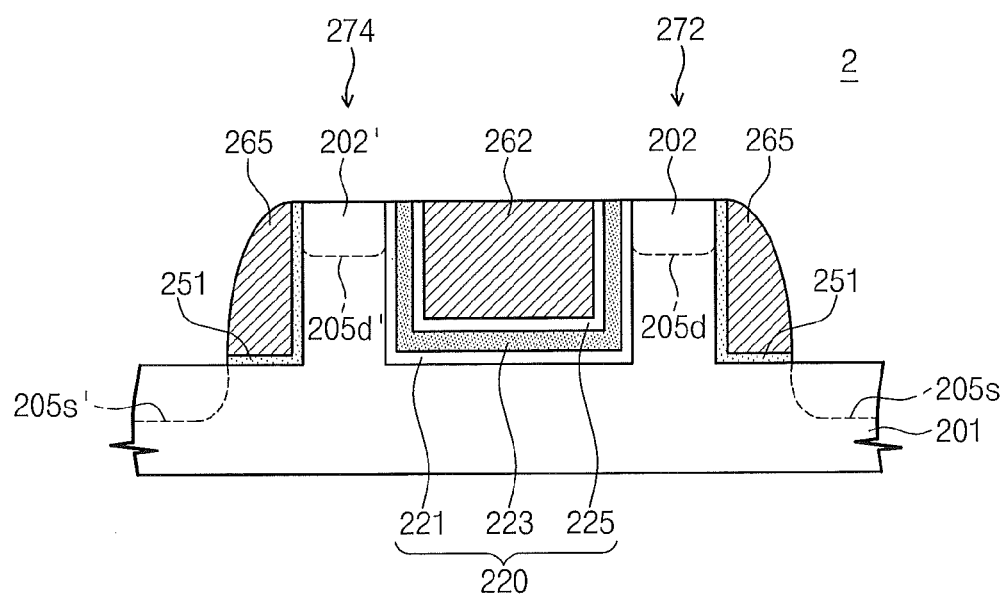
Figure 3G:
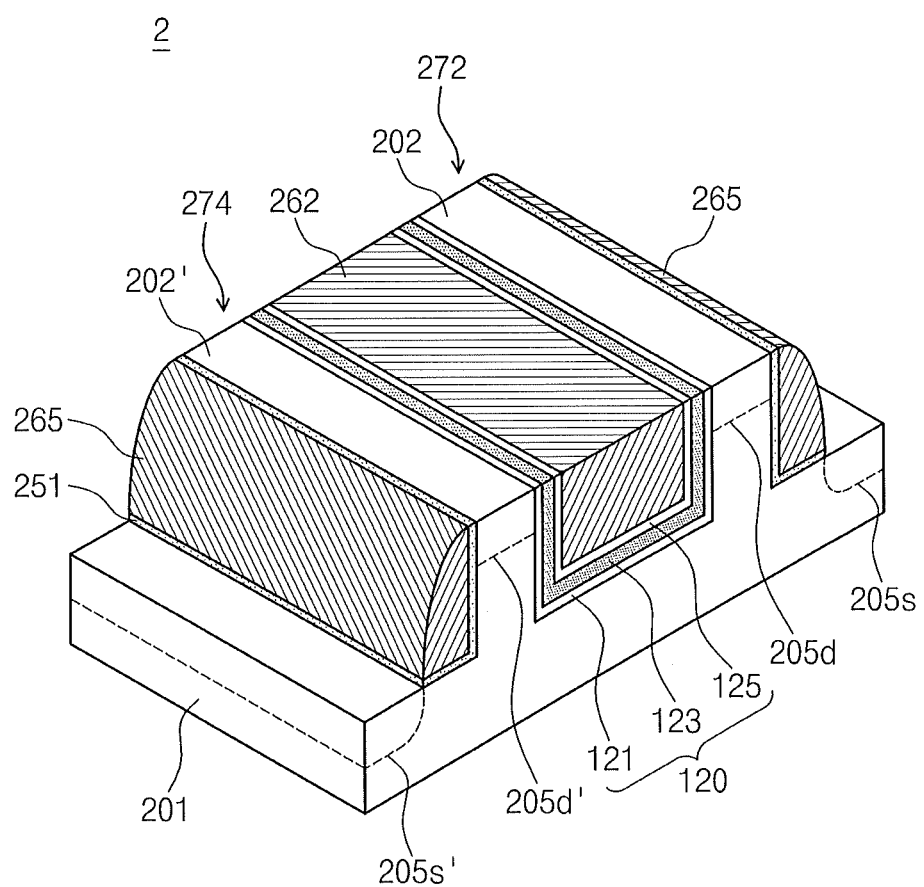
FIG. 3G is a perspective view of FIG. 3F.

Referring to FIGS. 3F and 3G, an upper portion of the vertical channel 202 may be doped with impurities (for example, n-type dopant) to form a drain 205d. A source 205s may be formed in the semiconductor substrate 201 under a lateral side of the front gate 265. Through the processes described above, a semiconductor device 2 may be formed to have a vertical channel transistor (VCT). The semiconductor device 2 may be applied to the memory device and/or the logic device. For example, the semiconductor device 2 may be a DRAM having the VCT and a capacitor electrically connected to the VCT.

Embodiments of FIGS. 3F and 3G may also be regarded as providing a semiconductor device that comprises a substrate 201, a first transistor 272 in the substrate 201, and a second transistor 274 in the substrate. Each of the first and second transistors 272 and 274 comprises a source region 205s, 205s', a drain region 205d, 205d' and a channel 202, 202' therebetween. A carrier storage region 220 is provided in the substrate 201 between the first and second transistors 272 and 274. The carrier storage region 220 is configured to trap carriers therein, so as to change threshold voltages of the first and second transistors 272 and 274. An electrode 262 may also be provided that is configured to store carriers in the carrier storage region 220, and the carrier storage region 220 may be on the electrode 262 and extends from a face (e.g., bottom surface) to opposite sides thereof. The source regions 205s, 205s' may be adjacent a face of the substrate 201 and the drain regions 205d, 205d' may be remote from the face of the substrate, and the respective channel regions 202, 202' are between the respective first and second source regions 205s and 205s' and the respective first and second drain regions 205d and 205d'.

According to some embodiments, the semiconductor device 2 may be set up to have at least one desired value of threshold voltage using a body bias effect as described below.

Figure 4A:
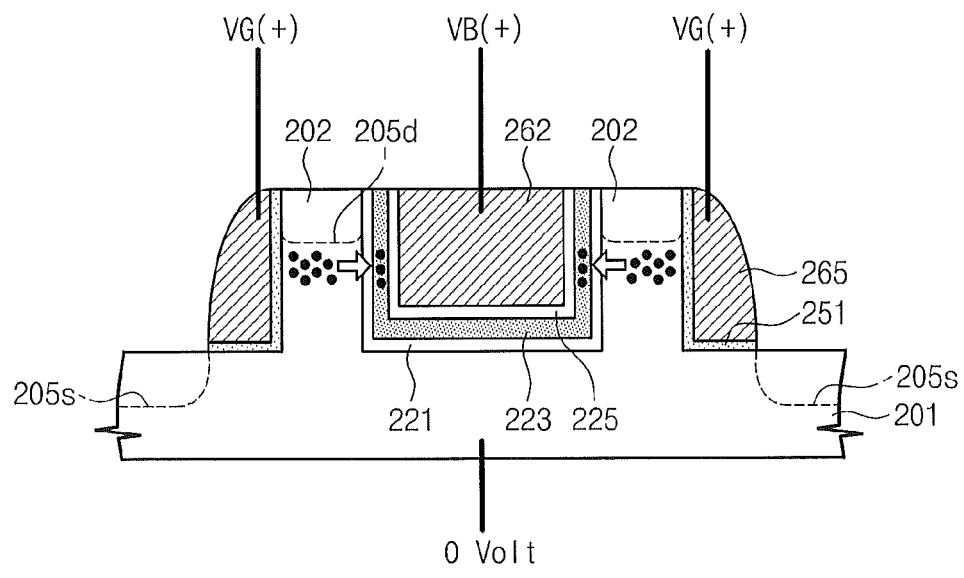
FIGS. 4A and 4B are cross-sectional views illustrating a method of adjusting threshold voltage of a semiconductor device according to some embodiments of the present inventive concepts.
Figure 4B:
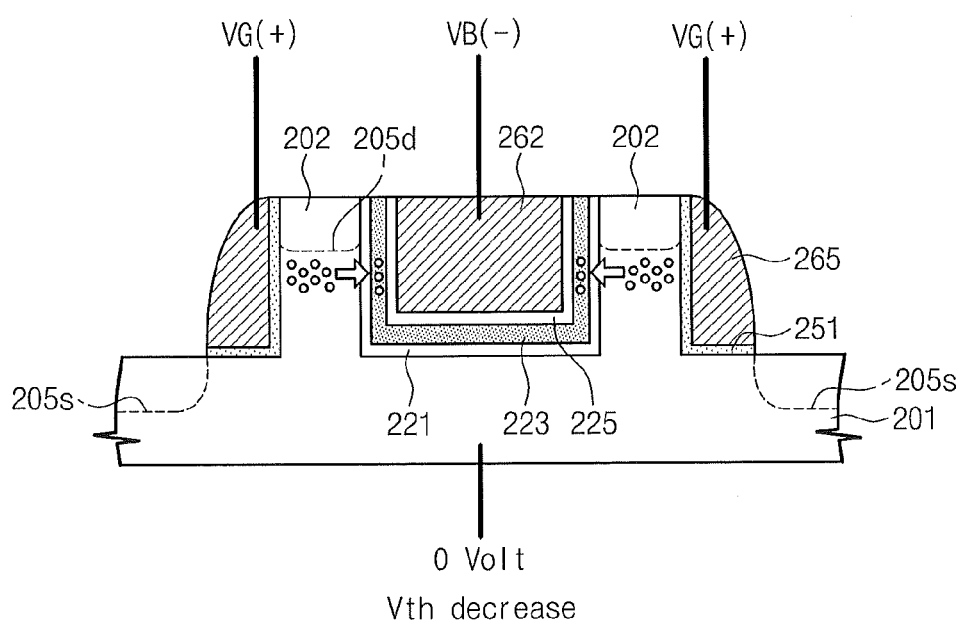

FIGS. 4A and 4B are cross-sectional views illustrating a method of adjusting threshold voltage of a semiconductor device according to some embodiments of the present inventive concepts.

Referring to FIG. 4A, the semiconductor substrate 201 may be supplied with 0 volt and the back gate 262 may be supplied with a positive back gate voltage VB(+). In this case, electrons (designated as solid circles) may tunnel through the tunneling dielectric layer 221 and then be stored in the trap dielectric layer 223. As described in FIG. 2A, a value of the threshold voltage Vth may be increased due to an expansion of the depletion width when the positive back gate voltage VB(+) is applied to the back gate 262. If the semiconductor device 2 is an NMOS type, the value of threshold voltage Vth may be increased under the condition that 0 volt is supplied to the semiconductor substrate 201 and the positive gate voltage VG(+) is supplied to the front gate 265. As explained in FIG. 2C, a raise of the positive back gate voltage VB(+) may increase the depletion width and the value of the threshold voltage Vth. According to an embodiment, the threshold voltages of the transistors corresponding to the vertical channels 202 disposed at both lateral sides of the back gate 262 may be increased to have same or similar value in response to the supply of the positive back gate voltage VB(+).

Referring to FIG. 4B, the semiconductor substrate 201 may be supplied with 0 volt and the back gate 262 may be supplied with a negative back gate voltage VB(−). In this case, holes (designated as hollow circles) may tunnel through the tunneling dielectric layer 221 and then be stored in the trap dielectric layer 223. As described in FIG. 2B, a value of the threshold voltage Vth may be decreased due to a shrinkage of the depletion width when the negative back gate voltage VB(−) is applied to the back gate 262. If the semiconductor device 2 is an NMOS type, the value of threshold voltage Vth may be decreased under the condition that 0 volt is supplied to the semiconductor substrate 201 and the positive gate voltage VG(+) is supplied to the front gate 265. As explained in FIG. 2D, a raise of absolute value of the negative back gate voltage VB(−) may decrease the depletion width and the value of the threshold voltage Vth. According to the embodiment, the threshold voltages of the transistors corresponding to the vertical channels 202 disposed at both lateral sides of the back gate 262 may be decreased to have same or similar value in response to the supply of the negative back gate voltage VB(−).

Figure 5A:
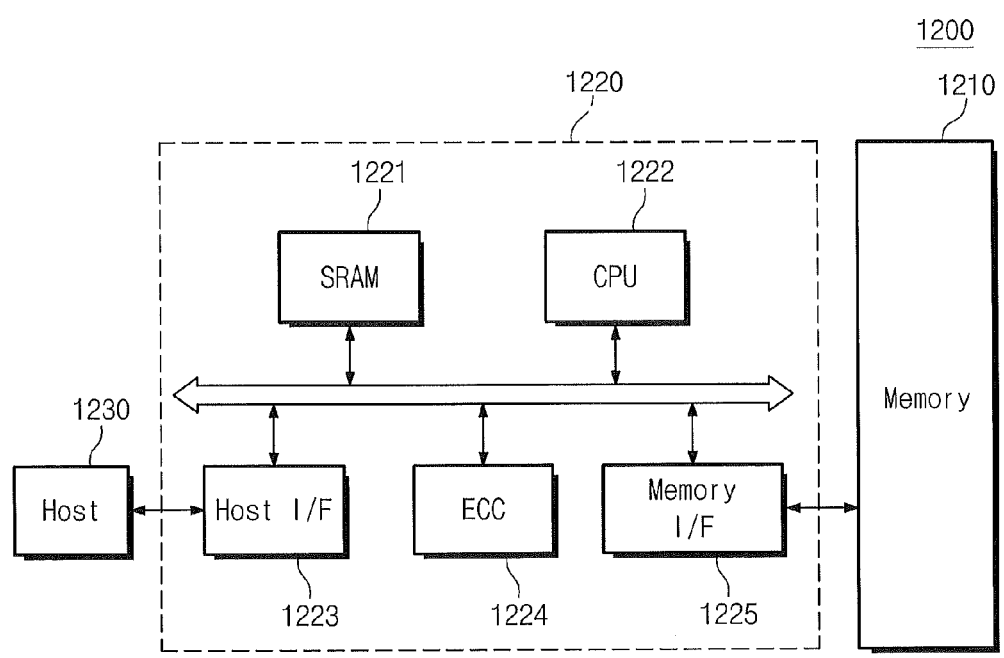
FIG. 5A is a schematic block diagram illustrating an example of memory cards including at least one of semiconductor devices according to embodiments of the present inventive concepts.

FIG. 5A is a schematic block diagram illustrating an example of memory cards including at least one semiconductor device according to embodiments of the present inventive concepts.

Referring to FIG. 5A, a memory card 1200 may include a memory controller 1220 generally controlling data exchange between a host and the flash memory device 1210. An SRAM 1221 is used as a work memory of a processing unit 1222. A host interface 1223 has a data exchange protocol of a host connected to the memory card 1200. An error correction coding block 1224 detects and corrects errors contained in data read from the multi-bit flash memory device 1210. A memory interface 1225 interfaces the flash memory device 1210 according to the example embodiments. The processing unit 1222 generally controls data exchange of the memory controller 1220. The memory 1210, the SRAM 1221 processing unit 1222, the host I/F 1223, the ECC 1224 and/or the memory I/F 1225 may comprise at least one of the semiconductor devices 1 and 2 according to any of the embodiments described herein.

Figure 5B:
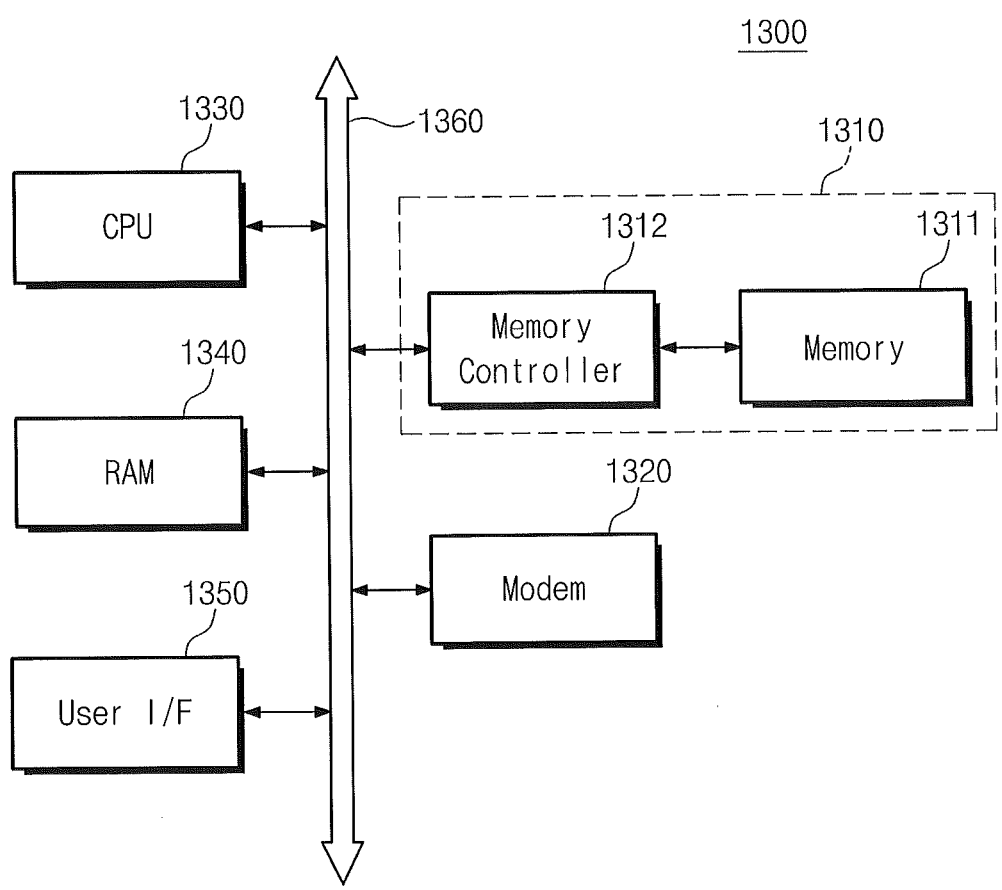
FIG. 5B is a schematic block diagram illustrating an example of information process system including at least one of semiconductor devices according to embodiments of the present inventive concepts.

FIG. 5B is a schematic block diagram illustrating an example of information process system including at least one semiconductor device according to embodiments of the present inventive concepts.

Referring to FIG. 5B, an information processing system 1300 may include a memory system 1310 having at least one of the semiconductor devices 1 and 2 according to various embodiments described herein. The information processing system 1300 includes a mobile device or a computer. For example, the information processing system 1300 may include a modem 1320, a central processing unit 1330, a RAM 1340, and a user interface 1350. The memory system 1310 may include a memory 1311 and a memory controller 1312 and have substantially the same configuration as that of the memory card 1200 in FIG. 5A. The memory system 1310 stores data processed by the central processing unit 1330 or data input from the outside. The information process system 1300 may be provided as a memory card, a semiconductor device disk, a camera image sensor, and other application chipsets. For example, the memory system 1310 may be realized as a solid state drive (SSD). In this case, the information processing system 1300 may stably store large data in the memory system 1310. Any of the blocks of FIG. 5B may include a semiconductor device 1 and 2 according to any of the embodiments described herein.

According to various embodiments described herein, there may be not needed a plurality of ion implantation processes to have various values of threshold voltage. Therefore, cost of manufacture may be not increased. As the value of threshold voltage may be determined by the value and/or applying time of voltage supplied to the back gate, the fabrication process may be simplified. It is possible to manufacture small sized devices having an increased carrier mobility because an undoped channel can be realized. Moreover, three-dimensional devices can be fabricated to have various threshold voltages using a bulk silicon wafer.

Although the present invention has been described in connection with the embodiments of the present invention illustrated in the accompanying drawings, it is not limited thereto. It will be apparent to those skilled in the art that various substitution, modifications and changes may be thereto without departing from the scope and spirit of the following claims.

What is claimed is:

1. A semiconductor device comprising:
a plurality of transistors, each including a front gate on a substrate;
a back gate between adjacent transistors; and
a carrier storage layer configured to surround the back gate and to trap a carrier,
wherein a threshold voltage of at least one of the transistors is changed in response to voltage applied to the back gate,
wherein the plurality of transistors comprises at least two vertical channel transistors (VCTs) each including a vertical channel extending vertically from the substrate and the front gate is disposed on an lateral side of the vertical channel, and
wherein the vertical channel comprises a drain therein remote from the substrate and the substrate comprises a source below a lateral side of the front gate.

2. The semiconductor device of claim 1, wherein the carrier storage layer comprises:
a tunneling dielectric layer adjacent the substrate;
a blocking dielectric layer adjacent the back gate; and
a carrier storable layer between the tunneling dielectric layer and the blocking dielectric layer,
wherein the carrier storable layer comprises a trap dielectric layer and/or a conductive layer.

3. The semiconductor device of claim 1, wherein the back gate is disposed on the substrate between confronting lateral sides of the adjacent vertical channels, and
wherein the carrier storage layer is disposed on the substrate between the vertical channel and the back gate on bottom and lateral surfaces of the back gate.

4. The semiconductor device of claim 1, wherein threshold voltages of the at least two VCTs are changed to have a same value in response to voltage applied to the back gate.

5. A semiconductor device comprising:
a plurality of transistors, each including a front gate on a substrate;
a back gate between adjacent transistors; and
a carrier storage layer configured to surround the back gate and to trap a carrier,
wherein a threshold voltage of at least one of the transistors is changed in response to voltage applied to the back gate,
wherein the plurality of transistors comprises first, second and third fin field effect transistors (FinFETs),
wherein the first to third FinFETs comprise:
first, second and third fins, respectively, on the substrate, the first to third fins being spaced apart from each other in a first direction; and
the front gate on the substrate extending in a second direction crossing the first direction to overlap the first to third fins,
wherein the back gate comprises a first back gate embedded in the substrate between the first and second FinFETs and a second back gate embedded in the substrate between the second and third FinFETs,
wherein the first back gate is supplied with a first voltage and the second back gate is supplied with a second voltage which is different from the first voltage such that respective first, second and third threshold voltages of the first to third FinFETs are changed to have different values, and
wherein the second, first and third threshold voltages are sequentially arranged in an ascending or descending value.

6. A semiconductor device comprising:
a substrate;
a first transistor in the substrate, the first transistor comprising first source and drain regions and a first channel therebetween;
a second transistor in the substrate and spaced apart from the first transistor, the second transistor comprising second source and drain regions that are spaced apart from the respective first source and drain regions and a second channel therebetween that is spaced apart from the first channel; and
a carrier storage region in the substrate between the first and second transistors, the carrier storage region configured to trap carriers therein so as to change threshold voltages of the first and second transistors,
wherein the first and second source regions are adjacent a face of the substrate, the first and second drain regions are remote from the face of the substrate and the respective first and second channel regions are between the respective first and second source regions and the respective first and second drain regions.

7. The semiconductor device of claim 6 wherein the carrier storage region is configured to trap carriers therein so as to differently change the threshold voltages of the first and second transistors.

8. The semiconductor device of claim 6 wherein the substrate comprises first and second protruding fins that are spaced apart from one another and extend parallel to one another, wherein the first source and drain regions and the first channel region are in the first protruding fin and wherein the second source and drain regions and the second channel region are in the second protruding fin.

9. The semiconductor device of claim 6 further comprising an electrode that is configured to store carriers in the carrier storage region.

10. The semiconductor device of claim 9 wherein the carrier storage region is on the electrode and extends from a face of the electrode to opposite sides thereof.

* * * * *